(12) United States Patent
Han et al.

(10) Patent No.: US 8,781,033 B2
(45) Date of Patent: Jul. 15, 2014

(54) APPARATUS AND METHOD FOR BREAKING TRAPPING SETS

(75) Inventors: Yang Han, Sunnyvale, CA (US); Shaohua Yang, San Jose, CA (US); Fan Zhang, Milpitas, CA (US); Zongwang Li, Dublin, CA (US)

(73) Assignee: LSI Corporation, San Jose, CA (US)

( * ) Notice: Subject to any disclaimer, the term of this patent is extended or adjusted under 35 U.S.C. 154(b) by 157 days.

(21) Appl. No.: 13/533,207

(22) Filed: Jun. 26, 2012

(65) Prior Publication Data

US 2013/0343495 A1 Dec. 26, 2013

(51) Int. Cl.
*H04L 27/06* (2006.01)

(52) U.S. Cl.
USPC ............. 375/340; 375/243; 375/341; 714/48; 714/704; 714/746; 714/764; 714/774; 714/799

(58) Field of Classification Search
CPC ..................... H03M 13/1142; H03M 13/1111; H03M 13/41; G11B 2020/185; H04L 25/067; H04L 1/0045; H04L 27/2647; H04L 25/03006; H04L 1/0054
USPC ............ 375/340, 243, 341; 714/48, 704, 746, 714/764, 774, 799
See application file for complete search history.

(56) References Cited

U.S. PATENT DOCUMENTS

| | | | |
|---|---|---|---|
| 7,088,793 B1 * | 8/2006 | Mickelson et al. | 375/341 |
| 2010/0042905 A1 | 2/2010 | Gunnam et al. | |
| 2011/0072335 A1 * | 3/2011 | Liu et al. | 714/796 |
| 2011/0167227 A1 * | 7/2011 | Yang et al. | 711/154 |
| 2011/0311002 A1 | 12/2011 | Li et al. | |
| 2013/0326316 A1 * | 12/2013 | Wu et al. | 714/800 |

\* cited by examiner

*Primary Examiner* — Leila Malek
(74) *Attorney, Agent, or Firm* — Otterstedt, Ellenbogen & Kammer, LLP

(57) ABSTRACT

An error correction data processing apparatus includes a noise predictive calibration circuit operable to calibrate a first set of filter coefficients based on a first data set and a second set of filter coefficients based on a second data set, and includes a first noise predictive detector operable to receive the first set of filter coefficients. The apparatus further includes a decoder operable to perform a first global iteration with the first noise predictive detector and determine a violation check count value, and a second noise predictive detector operable to receive the second set of filter coefficients if the violation check count value is less than a predetermined value or receive the first set of filter coefficients if the violation check count value is greater than the predetermined value.

24 Claims, 5 Drawing Sheets

APPARATUS AND METHOD FOR BREAKING TRAPPING SETS

BACKGROUND OF THE INVENTION

Various data transfer systems have been developed including storage systems, cellular telephone systems, and radio transmission systems. In each of the systems, data is transferred from a sender to a receiver via some medium. For example, in a storage system, data is transferred from a sender (e.g., via a write function) to a storage medium, and from the storage medium to a receiver (e.g., via a read function). The effectiveness of any data transfer is impacted by losses caused by various factors. In some cases, an encoding/decoding process is used to enhance the ability of a system to detect data errors and to correct such errors.

In an error detection and correction application, in attempting to recover a codeword (e.g., error correction encoded data), a decoder employing error correction may encounter one or more trapping sets that prevent the decoder from properly decoding the codeword. To improve error correction, turbo iteration between a decoder and a detector may employ different techniques to, for example, (i) break the trapping sets and/or (ii) prevent the error correction decoder from converging on trapping sets.

SUMMARY OF THE INVENTION

In accordance with one embodiment of the present invention, a method for improving error correction in a data processing system comprises steps of: calibrating a first set of filter coefficients based on a first data set and calibrating a second set of filter coefficients based on a second data set; receiving, by a first noise predictive detector, the first set of filter coefficients; performing a first global iteration with the first noise predictive detector and a decoder and determining a violation check count value; and receiving, by a second noise predictive detector, the second set of filter coefficients if the violation check count value is less than a prescribed value or the first set of filter coefficients if the violation check count value is greater than the prescribed value. Other described embodiments also include an error correction data processing apparatus and a data processing system.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments of a noise predictive calibration (NPCAL) and noise predictive filter (NPFIR) loading techniques adapted to be employed in a read channel communications apparatus. It is to be appreciated, however, that the invention is not limited to the specific apparatus and methods illustratively shown and described herein.

While illustrative embodiments of the invention will be described herein with reference to Low Density Parity Check (LDPC) and maximum a posteriori (MAP) techniques, it is to be appreciated that the invention is not limited to use with these particular techniques. Moreover, it will become apparent to those skilled in the art given the teachings herein that numerous modifications can be made to the embodiments shown that are within the scope of the present invention. That is, no limitations with respect to the specific embodiments described herein are intended or should be inferred.

As a preliminary matter, for the purposes of clarifying and describing embodiments of the invention, the following table provides a summary of certain acronyms and their corresponding definitions, as the terms are used herein:

Table of Acronym Definitions

| Acronym | Definition |
|---|---|
| NPCAL | Noise predictive calibration |
| NPFIR | Noise predictive finite impulse response |
| LDPC | Low density parity check |
| MAP | Maximum a posteriori |
| HDD | Hard disk drive |
| SNR | Signal to noise ratio |
| FIR | Finite impulse response |
| SOVA | Soft output Viterbi algorithm |
| LMS | Least mean square |
| DFIR | Digital finite impulse response |
| ADC | Analog-to-digital-conversion |
| NRZ | Non-return-to-zero |
| ROM | Read-only memory |
| RAM | Random access memory |
| DSP | Digital signal processor |
| CPU | Central processing unit |

Figure 1:
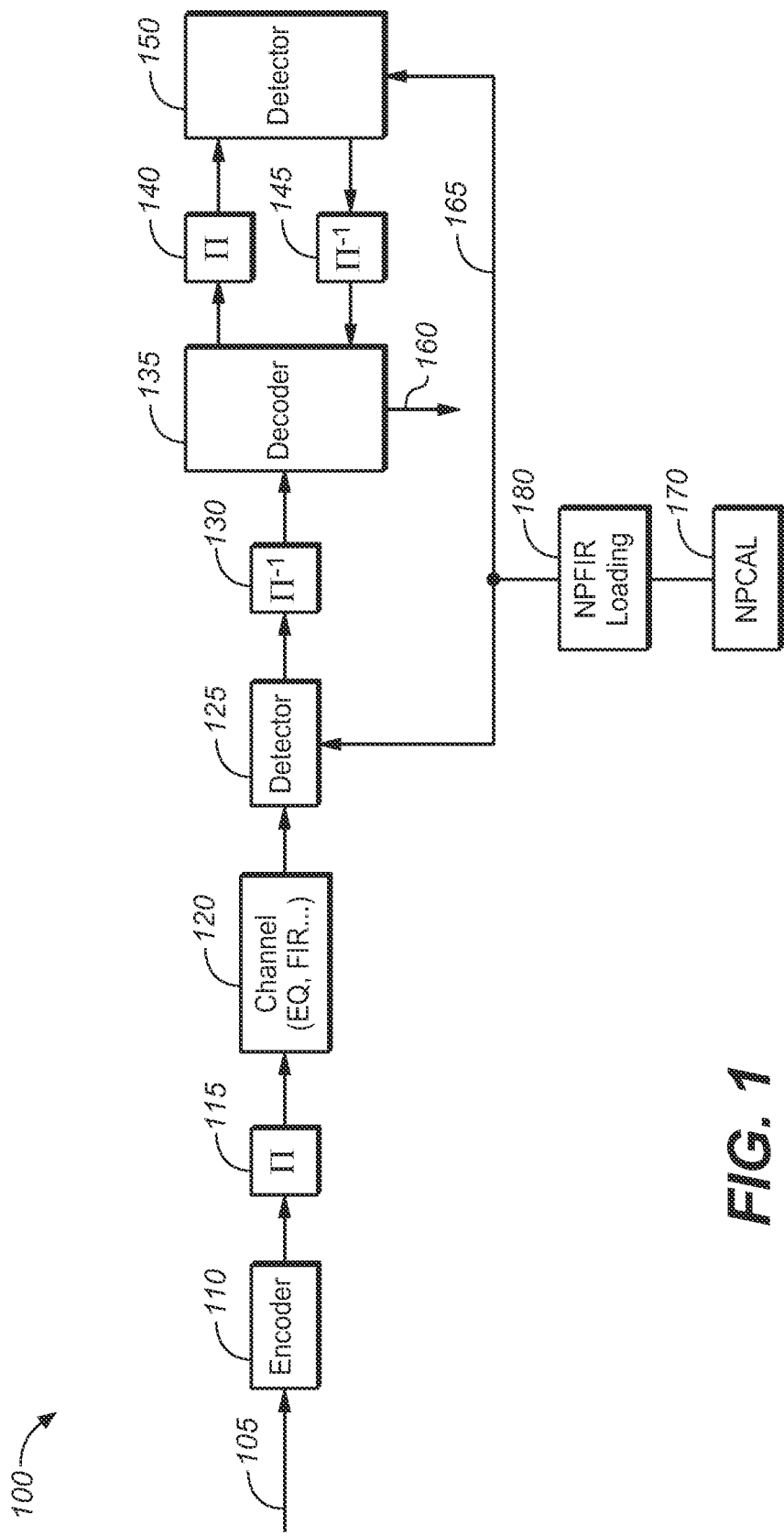
FIG. 1 is a functional block diagram illustrating an exemplary communications apparatus useful with one or more embodiments of the present invention.

FIG. 1 is a communications apparatus 100 for a storage device, such as a hard disk drive (HDD), with which techniques of the present invention may be used. In the write path of system 100 is a data source 105 that generates a set of bits called original information data, which is provided to a LDPC encoder 110. In the example of a HDD, the data sets may be sectors from a storage medium of the HDD. As its name suggests, LDPC encoder 110 is an error correction encoder that uses the LDPC error encoding correction technique to encode original information data to codewords. Iterative error correction codes (LDPC codes) are used to achieve lower bit error rates for a given signal to noise ratio (SNR). This technique is used for controlling errors in data transmissions over unreliable or noisy communication channels. It should be realized that other suitable encoding techniques can be used in different embodiments of the invention. The codewords are provided to an interleaver (Π) 115 where they are arranged in a non-contiguous way and provided to channel 120. One benefit of interleaving codewords is to reduce the effects that burst errors have on recovering codewords after they are stored on, for example, an HDD platter. Channel 120, for example, can be a storage media or communication media.

In the read path, analog data is retrieved from the medium in channel 120, where processing is performed on the data, such as amplification, analog-to-digital-conversion, finite impulse response (FIR) filtering, equalization and other processing techniques suitable for retrieving data from the medium. A detector 125 receives codewords from channel 120. The detectors in the read path may be other types of channel detectors known in the art, such as, a soft output Viterbi algorithm (SOVA) detector or a MAP algorithm detector. Based on the disclosure provided herein, one of ordinary skill in the art will recognize a variety of channel detectors that may be used in accordance with different embodiments of the present invention. In this embodiment of the present invention, detector 125 and a detector 150 are noise predictive channel detectors that implement the MAP detection technique, well known in the art. In this embodiment of the invention, detector 125 and detector 150 include NP filtering for branch metric calculations. An NPCAL circuit 170 includes a least mean square (LMS) algorithm, which is an adaptive filter, used to mimic a desired filter by finding filter coefficients as data is being read that relate to producing the least mean squares of the error signal (i.e., the difference between the desired and actual signal). NPCAL circuit 170 is connected to an NPFIR filter loading circuit 180 for loading filter coefficients into detectors 125 and 150 by way of signal path 165. Taking output from channel 120, NPCAL circuit 170 calibrates or trains data to achieve filter coefficients, as data is being read, for the noise predictive filters in detectors 125 and 150. That is, it is adaptively processing so as to self adjust and continually update the coefficients for improved filtering of noise at detectors 125 and 150. Output from detector 125 is de-interleaved using a de-interleaver ($\Pi^{-1}$) 130 because the bits of the codeword were interleaved in the write path and need to be rearranged back to the original order of for later decoding. De-interleaver ($\Pi^{-1}$) 130 provides the de-interleaved codeword to a LDPC decoder 135.

LDPC decoder 135 performs a data decoding process where the decoded data is either provided as a hard decision by way of output 160 or provided to an interleaver (Π) 140. Generally, where the data decoding process applied by LDPC decoder 135 converges, the converging result is provided as a hard decision at output 160 and the processing is completed for that particular data set. LDPC decoder 135 terminates when either (i) LDPC decoder 135 arrives at a converged codeword having zero syndrome, i.e., number of violated checks is zero, or (ii) LDPC decoder 135 performs a maximum allowable number of local iterations without arriving at the correctly decoded codeword, i.e., LDPC decoder 135 has failed. When decoder 135 terminates, it outputs decoded codeword as a hard decision at output 160. It should be noted that other suitable decoding techniques can be used in different embodiments of the invention.

Alternatively, if, after a predetermined number of global iterations, LDPC decoder 135 does not converge on a valid codeword, then (i) the unsatisfied check nodes values are determined and (ii) the unsatisfied check nodes values are compared to a specified threshold value (e.g., 20). The specified threshold value, which may be determined experimentally, may be used to predict whether decoder 135 has (i) converged on a trapping set or (ii) experienced an error in the communication channel that does not correspond to convergence on a trapping set. If the unsatisfied check node values are greater than or equal to the specified threshold value, then it is likely that decoder 135 has experienced an error in the communication channel. Such errors may result from, for example, a flaw on the HDD platter or excessive noise in the communication channel. When such errors occur, further action, such as re-reading of the data, may be needed to recover the correct codeword. In some cases, decoder 135 might not be capable of recovering the correct codeword. If the value of unsatisfied check nodes is less than the specified threshold value, then it is likely that decoder 135 has converged on a trapping set failure or error. When a trapping set occurs, certain techniques, such as those disclosed herein in accordance with the present invention, can be used to break-the-trap and cause the decoder to converge.

After the first global iteration between detector 125 and decoder 135 and the data decoding process fails to converge, the non-converging data set is provided to interleaver (Π) 140 for interleaving and provided to detector 150 where it performs a subsequent data detection aided by the output data generated by LDPC decoder 135. Before detector 150 begins the detection process, the filter coefficients processed by NPCAL circuit 170 are loaded in detector 150 from NPFIR filter loading circuit 180 by way of signal path 165. This assures that the most recent calculated filter coefficients are used by detector 150. By using the previously generated data, detector 150 generally performs a subsequent detection with heightened accuracy. The output of this subsequent channel detection is passed to de-interleaver ($\Pi^{-1}$) 145 because the data was previously interleaved. The interleaved data is provided to LDPC decoder 135 where it provides another decoding pass to the data by performing one or more decoding iterations ("local iterations") in an attempt to generate a correctly decoded codeword. Similar to the first iteration, a decision is made as to whether the data converges. Where the data converges, LDPC decoder 135 writes its output as hard decision to output 160 and the processing is complete for that particular data set. Alternatively, where the data does not converge, LDPC decoder 135 provides its output to interleaver (Π) 140 where it is passed back to detector 150 for another global iteration where such is necessary and possible. A simple architecture is shown in FIG. 1 for illustrative brevity, although it will be recognized that comparable architectures with multiple origination points and input/output arrangements as well as different topologies may be utilized consistent with the invention.

Generally, belief-propagation decoders (e.g., LDPC decoder 135) are sub-optimal decoders that pass reliability information iteratively between check nodes (e.g., parity check nodes) and variable nodes (e.g., bit nodes) in a locally operating fashion. The check nodes and variable nodes only know information from their adjacent nodes (nodes that are connected).

Due to the existence of cycles in LDPC codes, such decoders are subject to small errors, such as trapping set errors, mentioned above. In accordance with embodiments of the present invention, trapping set error recovery is achieved through NPCAL and NPFIR filter loading in read channel systems where noise predictive detectors are used, for example, detector 125 and detector 150.

In an initial stage of message passing decoding, the presence of special low-probability noise samples, variable nodes internal to one particular trapping set (termed the initial trapping set) experience a large increase in reliability estimates for incorrect bit values. This information is propagated to other variable nodes in the trapping set, some of which already have unreliable bit estimates themselves. After this initial biasing, external variables usually start to correct their initially incorrect estimates. However, by that time, the variable nodes in a trapping set have already significantly biased their decisions towards the wrong values. Since there are very few check nodes capable of detecting errors within trapping sets, this erroneous information persists in the graph until the end of the decoding process. In accordance with embodiments of the invention, an effective way to prevent trapping set failure is to disturb the channel before the decoder reaches its "saturated" stage leading to trapping sets.

In accordance with embodiments of the present inventions, the turbo iteration between a decoder and a detector is used to improve performance; for example, LDPC decoder 135 and detector 150 shown in FIG. 1. Turbo iteration naturally introduces a certain level of disturbance to an LDPC decoder, causing transient trapping set failures (the error pattern changes from global iteration to global iteration). In some cases, the interruption from the detector is still very limited to break the strong noise that leads to a trapping set, so a stronger disturbance is needed. In one embodiment of the invention, a second detector is modified during detection in the second and above global iterations to break the trapping set; for example, modifying detection of detector 150 in the second and above global iterations. After a first global iteration between a first detector and a decoder finish (i.e., detector and first decoder run finish), if the error event is likely to be a trapping set error (i.e., the number of unsatisfied checks is smaller than a prescribed (e.g., programmed) threshold), different noise predictive filter coefficients are loaded in a second detector for the remaining global iterations, in accordance with embodiments of the invention. This can effectively break the noise pattern, thus leading to convergence of the decoder.

Figure 2:
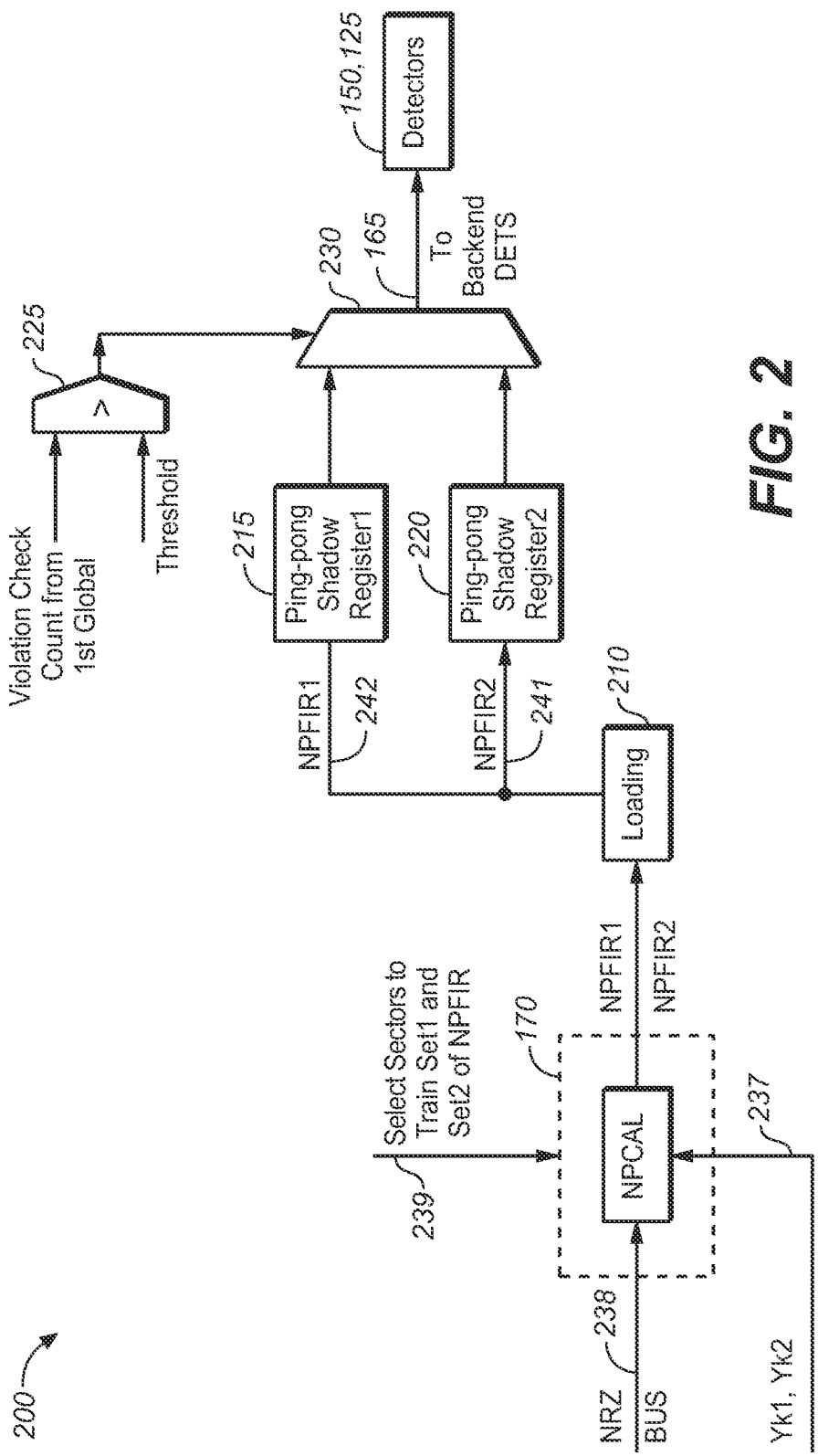
FIG. 2 shows exemplary components of a noise predictive calibration (NPCAL) and noise predictive filter (NPFIR) loading architecture in accordance with an embodiment of the present invention.

Embodiments of the present invention are directed towards an apparatus and technique that provides an alternative implementation for correcting small errors, such as trapping set errors, that occur when decoding codewords. In particular, FIG. 2 shows exemplary components of an NPCAL and NPFIR filter loading architecture 200, in accordance with an embodiment of the present invention. FIG. 2 is discussed in the context of the exemplary communications apparatus 100 with noise predictive detectors, shown in FIG. 1, but is not limited to this arrangement.

In the NPCAL and NPFIR filter loading architecture 200 there is a first detector in the read path after the channel and a second detector at the backend, for example, as detectors 125 and 150 are arranged in FIG. 1. Referring to FIGS. 1 and 2, NPCAL circuit 170 is operative for calibrating or training filter coefficients for use by the detectors. In this embodiment, NPCAL circuit 170 includes a noise predictive filter, such as an NPFIR response filter, as is known in the art. As codewords are being read, NPCAL circuit 170 applies an LMS algorithm to calculate two sets of filter coefficients that relate to a difference between the desired signal and the actual signal. Two sets of sectors, of different quantity (e.g., set1=1000 sectors and set2=500 sectors), are sampled by NPCAL circuit 170 and are calibrated to achieve the filter coefficients for the noise predictive filters of detectors 125 and 150. NPCAL circuit 170 adaptively calibrates the two sets of sectors in parallel to determine both sets of filter coefficients. The coefficients are adaptively updated using previous coefficient values and newly sampled sets of sectors to continually determine and update both sets of filter coefficients for the noise predictive filters of the detectors.

In accordance with embodiments of the present invention, NPCAL circuit 170 samples a sector to calibrate or train a first set of filter coefficients (denoted NPFIR1 in FIG. 2) and samples a second sector to calibrate or train a second set of filter coefficients (denoted NPFIR2 in FIG. 2), resulting in two sets of filter coefficients (NPFIR candidates) to use for the detection. In accordance with embodiments of the invention, the first and second sets of coefficients are loaded into detector 125 (for the ongoing adaptive processing and detection and filtering) and either the first or the second set of coefficients is loaded into detector 150. For example, if a trapping set error is found to occur, the second set of coefficients is loaded into detector 150 in an attempt to break the trapping set. In particular, if a trapping set error is found to occur after a first global iteration between detector 125 and decoder 135, the second set of coefficients is loaded into detector 150 for the second and above global iterations between detector 150 and decoder 135 in an attempt to break the trapping set. The filter coefficients are loaded in the detectors at the end of each data set being processed by the detectors and are used in performing detection of the subsequent data set received by the detector.

By way of an input control signal 239, NPCAL circuit 170 is operative to sample two sets of sectors of the outgoing data stream from channel 120. The signal to sample the sectors is supplied from the read head, which senses magnetic orientation on the media and generates a read-back signal. The read-back signal is then processed by one or more of a plurality of processing techniques, such as, but not limited to, amplification, analog-to-digital-conversion (ADC), digital finite impulse response (DFIR) filtering, equalization and other processing techniques suitable for retrieving data from the medium, each well known in the art. The amount of sectors and methodologies for selecting the sectors are experimentally based, according to embodiments of the invention, using techniques well known in the art. The sampled sectors (denoted Yk1 and Yk2) comprise codewords and noise. Both sets of sampled sectors Yk1, Yk2 are provided to the NPCAL circuit 170 via an input 237 and are used to calibrate the first set of filter coefficients (NPFIR1) and the second set of filter coefficients (NPFIR2).

An input 238 to the NPCAL circuit 170 is adapted for connection with a non-return-to-zero (NRZ) bus for providing a bipolar sequence of NRZ data to the NPCAL circuit for processing. The NRZ bus is part of a larger system connected to communications apparatus 100, such as, for example, a host computer, and carries data encoded in an NRZ format to the read or write channel circuitry. As is known by those skilled in the art, the NRZ format is a method of coding data in which the signal representing binary digits alternates between a positive and zero (or negative) voltage when there is a change in successive bits, either from a high (1) to a low (0), or vice versa.

Figure 3:
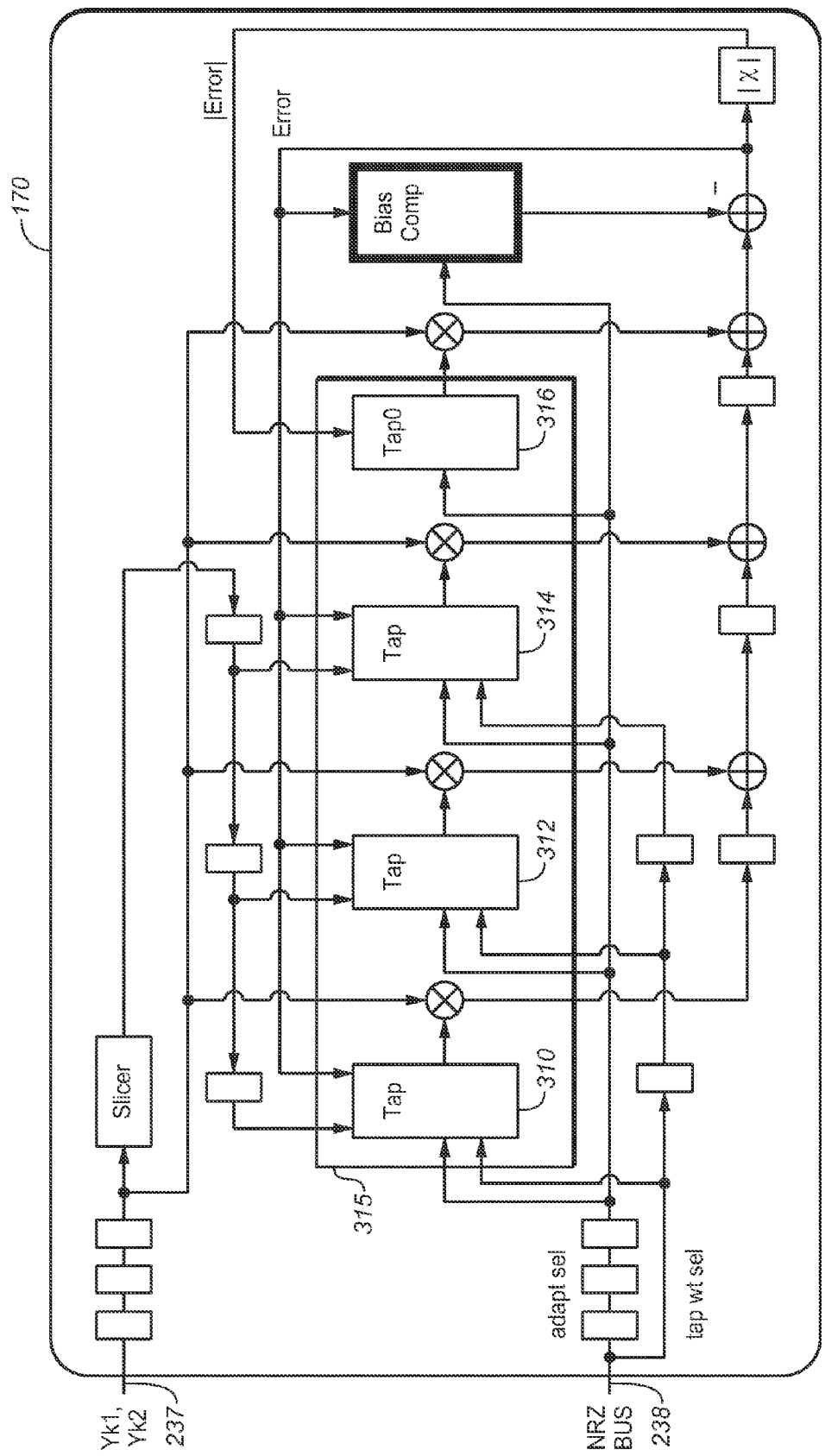
FIG. 3 shows exemplary components of an NPCAL architecture used in accordance with an embodiment of the present invention.

FIG. 3 shows additional detail of input 237 and input 238 for the sampled data Yk1, Yk2 and the NRZ data, respectively. As part of a calibration process, the Yk1 and Yk2 sample data and the NRZ data are processed to establish an error or noise value that is used to adjust coefficients 315, in a manner well known in the art. In this example, there are four coefficients (denoted as taps) 310, 312, 314 and 316. Referring back to FIG. 2, in this exemplary embodiment of the present invention, as part of the calibration process, NPCAL circuit 170 applies the LMS algorithm to the two sample sectors (Yk1 and Yk2) and the NRZ data to calculate the noise or error for use in adapting or adjusting the coefficients, as a way to minimize noise. The process runs in parallel because NPCAL circuit 170 is calibrating two sets of coefficients, namely, NPFIR1 and NPFIR2. It should be noted that the NPCAL circuit 170 is duplicated in this embodiment, but is shown as a single circuit for illustrative and descriptive clarity. Alternatively, in accordance with other embodiments of the invention, the first and second sets of coefficients can be calculated sequentially using a single NPCAL circuit 170 by switching between the first set and second set of sampled sectors. In this scenario, a multiplexer or alternative switching circuitry (not explicitly shown) can be included for switching between the first and second sets of sampled sectors. Detectors use the coefficients as part of the detection process to filter the data so it can be closer to the expected data and better prepared for decoding, thereby improving performance.

Figure 5:
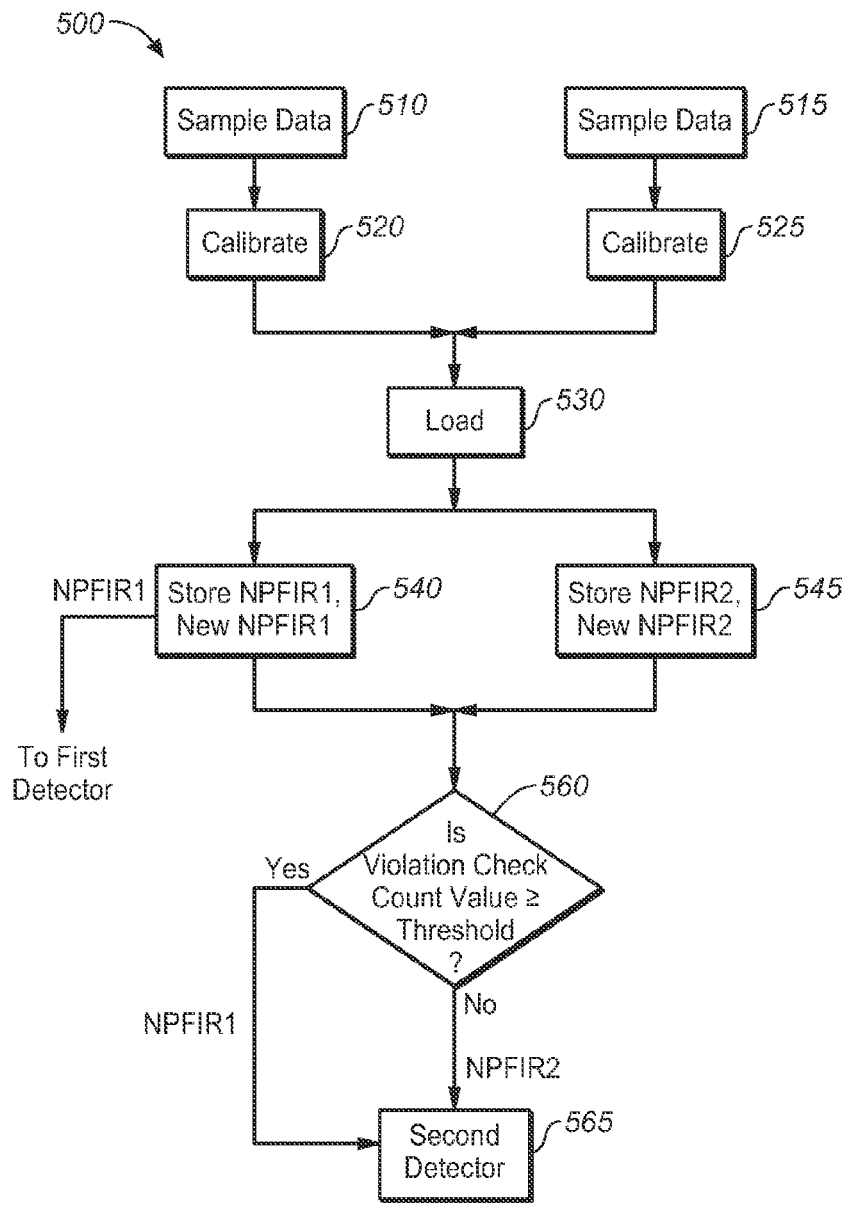
FIG. 5 is a flow diagram depicting at least a portion of an exemplary method in accordance with the architecture shown in FIG. 2, according to an embodiment of the present invention.

FIG. 5 is a flow diagram 500 depicting at least a portion of an exemplary method in accordance with the architecture shown in FIG. 2. At block 510, NPCAL circuit 170 samples, for example, 1000 sectors of data for calibrating the first set of filter coefficients (NPFIR1) and samples, for example, 500 sectors of data for calibrating the second set of filter coefficients (NPFIR2) at block 515. At blocks 520 and 525, NPCAL circuit 170 runs two calibration processes in parallel generating two diverse sets of coefficients (candidates: NPFIR1 and NPFIR2) for use by detectors 125 and 150.

After NPCAL circuit 170 determines first and second sets of coefficients (NPFIR1 and NPFIR2), the first set of coefficients NPFIR1 are loaded into detector 125 as part of the adaptive training or calibration process of updating and improving the coefficients. In this embodiment of the present invention, at block 530, a loading module 210 (in FIG. 2) loads NPFIR1 into a first ping-pong buffer, which in FIG. 2 is shown as ping-pong shadow register1 215, which is passed through a multiplexer 230 to detector 125, at block 540, as part of the adaptive calibration process before loading detector 150 with either NPFIR1 or NPFIR2. In this embodiment, NPFIR filter loading circuit 180, shown in FIG. 1, includes loading circuit 210, a first ping-pong buffer 215, a second ping-pong buffer 220, a comparator 225 and a multiplexer 230. Also updated with a set of filter coefficients is detector 150.

In accordance with an embodiment of the present invention, detector 150 has access to two sets of distinct coefficients, either NPFIR1 or NPFIR2, one of which will be loaded into detector 150. As indicated above, the sets of coefficients are distinct at least in part because they are based on different sector samples and different sector sample sizes. Embodiments of the invention, however, are not limited to any specific sector samples and/or sample sizes. Ping-pong buffers 215, 220 are used as part of the loading process since detector 150 accesses the currently available coefficients while detector 125 is updating and loading new coefficients.

With continued reference to FIGS. 2 and 5, at block 530, loading circuit 210 loads the first set of coefficients (NPFIR1) into the first ping-pong buffer 215 via input 242 and loads the second set of coefficients (NPFIR2) into the second ping-pong buffer 220 via input 241. At block 540, a buffer in ping-pong buffer 215 holds the result of a prior set of coefficients (e.g., coefficients (NPFIR1) currently available to detector 150) from NPCAL circuit 170, while another buffer in ping-pong buffer 215 holds a new set of coefficients (New NPFIR1) from NPCAL circuit 170 that is currently being determined. Similarly, at block 545, a buffer in ping-pong buffer 220 holds the result of a prior set of coefficients (e.g., coefficients (NPFIR2) currently available to detector 150) from NPCAL circuit 170, while another buffer in ping-pong buffer 220 holds a new set of coefficients (New NPFIR2) from NPCAL circuit 170 that is currently being determined. An output signal from comparator 225 triggers multiplexer 230 to switch between the outputs of ping-pong buffers 215 and 220, allowing only one set of coefficients (e.g., either NPFIR1 or NPFIR2) to be loaded into detector 150.

Comparator 225 receives a prescribed threshold value representing a number of unsatisfied check nodes, for example, a predetermined value or count likely to represent a trapping set error. The predetermined value is compared to a violation check count value by comparator 225 and an output signal indicative of the comparison result is then used to control the multiplexer 230 to determine from which of the ping-pong buffers 215 or 220 to receive the filter coefficients. In this embodiment of the present invention, the violation check count value is a number of the unsatisfied check nodes of decoder 125, the first time the decoder is called. For example, the violation check count value is sampled after the first global iteration between detector 125, interleaver (II) 140 and decoder 135, shown in FIG. 1.

In this embodiment, at decision block 560, if the violation check count value is greater than or equal to the threshold value, comparator 225 triggers multiplexer 230 to load the set of coefficients (e.g., NPFIR1) from the first ping-pong buffer 215 into detector 150, at block 565. Alternatively, at decision block 560, if the violation check count value is less than the threshold value (e.g., a trapping set), comparator 225 triggers multiplexer 230 to load the set of coefficients (e.g., NPFIR2) from the second ping-pong buffer 220 into detector 150, at block 565. It should be realized that after the first global iteration (detector 125 and first decoder run finish), if the error event is likely to be a trapping set error (number of unsatisfied check nodes/violation check count value is smaller than the threshold value), different noise predictive filter coefficients are loaded into detector 150 for the remaining global iterations between decoder 135 and detector 150; for example, modifying the detection of detector 150 in the second and above global iterations. This can effectively break the noise pattern, such as a trapping set error, leading to convergence of the decoder.

Figure 4:
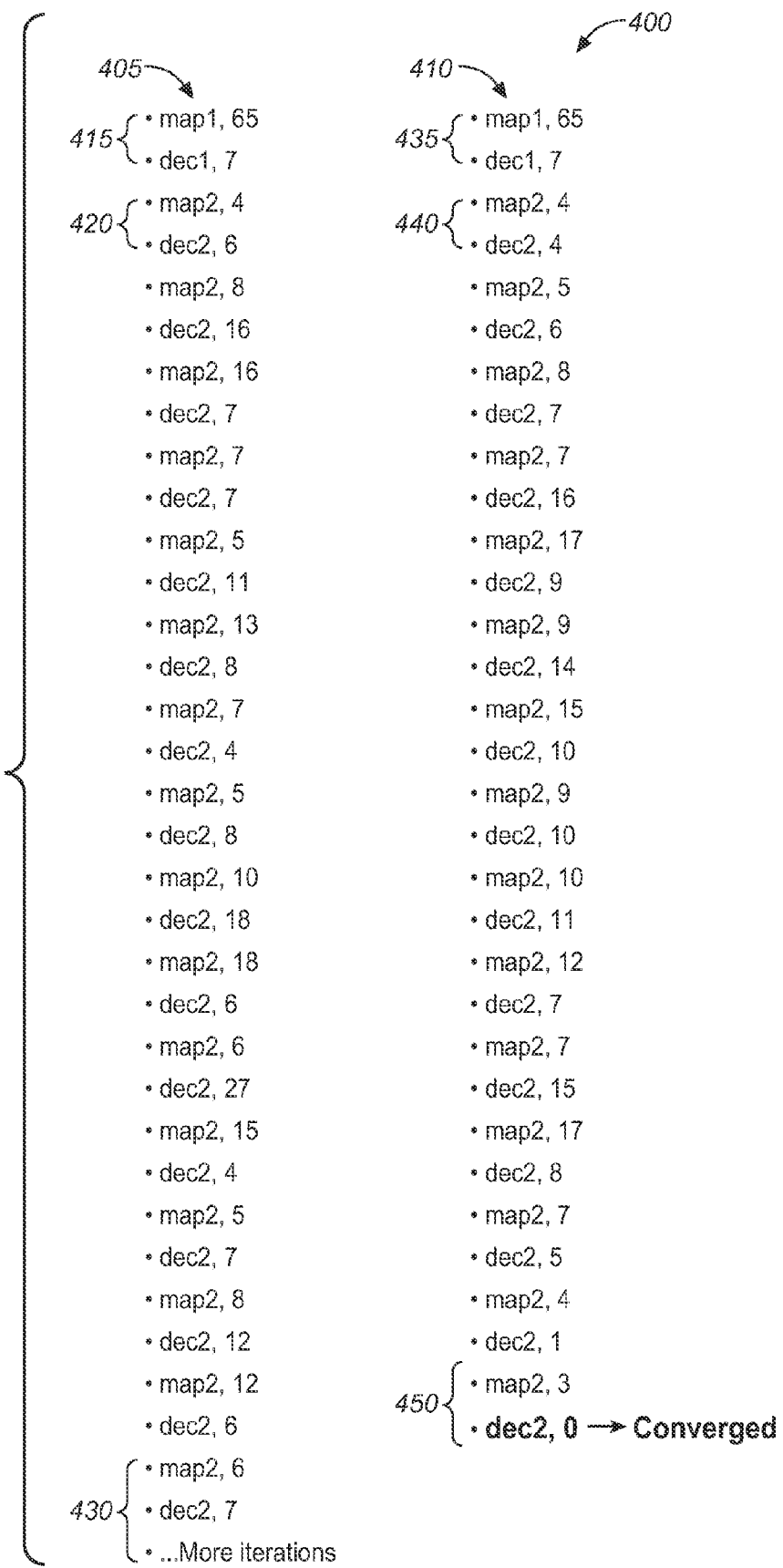
FIG. 4 is a table of exemplary data showing the convergence behavior of an exemplary data sector applied to a prior art system that fails to a trapping set (left column), and the same data sector applied to an apparatus in accordance with the invention that converges (right column)

FIG. 4 is a table 400 of illustrative turbo iteration data comparing detector/decoder output with real data written, according to an embodiment of the invention. The data represents the convergence behavior (e.g., number of bit errors) of a sector applied to a prior art error correction system that fails to a trapping set (left column 405) and the same sector applied to a system in accordance with the present invention (right column 410) that converges. Looking at table 400, column 405 shows prior art results from iterations between, for example, detector 125 and LDPC decoder 135 and between detector 150 and LDPC decoder 135, shown in FIG. 1. It should be noted that the data in column 405 and 410 represents an exemplary data set based on the same 4 k bit sector. Each row in column 405 and 410 includes a number of bit errors related to detector 125 (denoted map1), detector 150 (denoted map2), LDPC decoder 135 (denoted dec1: representing a first global iteration between detector 125 and LDPC decoder 135), and LDPC decoder 135 (denoted as dec2: representing a global iteration between detector 150 and LDPC decoder 135). As apparent from the table, there are multiple global iterations between detector 150 and LDPC decoder 135, as indicated by multiple map2-dec2 data sets.

The data in column 405 associated with map1-dec1 represents a global iteration between detector 125 and LDPC decoder 135, where the decoder is called for the first time to process the sector (codewords) from the channel. Referring to FIG. 1, for example, this is generally represented by the communication path between detector 125, interleaver ($\Pi^{-1}$) 130 and decoder 135. The data in column 405 associated with map2-dec2 represent a global iteration between, for example, detector 150 and LDPC decoder 135. In FIG. 1, for example, this path is generally represented by the path between LDPC decoder 135, interleaver ($\Pi$) 140, de-interleaver ($\Pi^{-1}$) 145 and detector 150.

The data in column 410 shows bit error results, in accordance with the invention, from iterations between, for example, detector 125 and LDPC decoder 135 and between detector 150 and LDPC decoder 135, shown in FIG. 1 and employing the architecture described in FIG. 2. The data in column 410 associated with map1-dec1 represents a global iteration between detector 125 and LDPC decoder 135, where the decoder is called for the first time to process the sector (codewords) from the channel. Referring to FIG. 1, for example, this is generally represented by the communication path between detector 125, interleaver ($\Pi^{-1}$) 130 and decoder 135 employing the architecture described in FIG. 2. The data in column 410 associated with map2-dec2 represent a global iteration between, for example, detector 150 and LDPC decoder 135 employing the architecture described in FIG. 2. This path in FIG. 1, for example, is generally represented by the path between LDPC decoder 135, interleaver ($\Pi$) 140, de-interleaver ($\Pi^{-1}$) 145 and detector 150. As shown in table 400, there are numerous global iterations between detector 150 and decoder 135, as indicated by numerous examples of map2-dec2 bit errors. It should be realized that the data in column 405 is processed by a prior art arrangement (e.g., processing one set of coefficients or one candidate) that fails to converge and enters a trapping set error, while the data in column 410 converges, as a result of being processed by an arrangement in accordance with the invention (e.g., processing two sets of filter coefficients or two candidates).

Referring to column 405, processing with a single set of coefficients (as know in the art), in global iteration 1 (415), after detecting by detector 125 (map1) the sector had 65 bit errors and after decoding by decoder 135 (dec1) the sector had 7 bit errors. After the first global iteration between detector 125 and LDPC decoder 135, the sector is processed through a number of global iterations between detector 150 and decoder 135, denoted by map2-dec2.

In global iteration 2 (420) utilizing a single set of coefficients, after detecting by detector 150 (map2) the sector had 4 bit errors and after decoding by decoder 135 (dec2) the sector had 6 bit errors. Referring to the bottom of column 405 (430), had decoder 135 converged, the LDPC decoding would have been considered successful and detector 125 could have accepted the next sector to decode. However, decoder 135 did not converge and thus, failed. It should be realized that the size of the bit errors, although small compared to the much larger 4 k bit sector, fail to converge to zero or correct in column 405 within a predetermined number of iterations n. This behavior is an indication of a trapping set, which is a problem among prior art systems.

In accordance with embodiments of the invention, one way of breaking the trapping set of the exemplary data set shown in column 405, is to load a second set of coefficients into detector 150 after the first global iteration between detector 125 and decoder 135. Turning to column 410, it is to be appreciated that the data in column 410 represents an exemplary data set based on the same 4 k bit sector used to produce the data set in column 405, but the data set in column 410 was processed in accordance with embodiments of the invention and converges to zero indicating no errors.

Looking at column 410, global iteration 1 (435), represents a first global iteration between detector 125 (map1) and decoder 135 (dec1), where the decoder is called for the first time to process the sector (codewords) from the channel. After detecting by detector 125 (map1) the sector has 65 bit errors and after decoding by decoder 135 (dec1) the sector has 7 bit errors. After the first global iteration between detector 125 (map1) and decoder 135 (dec1), the number of bit errors is the same as in the prior art example data set in column 405 because the same sector is processed in the same manner. However, in accordance with embodiments of the invention, after this first global iteration, a different noise predictive filter coefficient is loaded in detector 150 for the global iterations between detector 150 (map2) and the decoder 135 (dec2) in an attempt to break the trapping set.

In global iteration 2 (440) utilizing the second set of coefficients, after detecting by detector 150 (map2) the sector had 4 bit errors and after decoding by decoder 135 (dec2) the sector had 4 bit errors. Referring to FIGS. 2 and 4, for global iteration 2 (440), loading circuit 210 loads the first set of coefficients in detector 125 as part of the process to continually update the coefficients and loads the two sets of coefficients in ping pong buffers 215 and 220, respectively. The violation check count value from the first global iteration is compared by comparator 225 to the threshold value, set to for example to 20. If the violation check count value (i.e., unsatisfied check nodes) is less than the threshold value, then comparator 225 triggers multiplexer 230 to load the second set of coefficients (e.g., NPFIR2) from ping pong buffer 220 to detector 150. In this particular example, the violation check count value is 7 (435) indicating a trapping set, thus triggering comparator 225 to signal multiplexer 230 to load the second set of coefficients (e.g., NPFIR2) to detector 150. If the violation check count value is greater than or equal to the threshold value, then multiplexer 230 loads the first set of coefficients (e.g., NPFIR1) from ping pong buffer 215 to detector 150 (not the case in the present data set). Once the second set of coefficients are loaded to detector 150, detector 150 continues with global iterations between the decoder while receiving updated coefficients (e.g., NPFIR2) from detector 125 until the decoder converges or times out. In this example, the decoder converges to 0, indicating no bit errors (450).

Embodiments of the invention can employ hardware, software, or hardware and software aspects. Software includes but is not limited to firmware, resident software, microcode, etc. One or more embodiments of the invention or portions thereof may be implemented in the form of an article of manufacture including a machine readable medium that contains one or more programs which when executed implement method step(s) used to perform at least portions of embodiments of the invention; that is to say, a computer program product including a tangible computer readable recordable storage medium (or multiple such media) with computer usable program code stored thereon in a non-transitory manner for performing one or more of the method steps indicated. Furthermore, one or more embodiments of the invention or elements thereof can be implemented in the form of an apparatus including a memory and at least one processor (e.g., a DSP) coupled with the memory and operative to perform, or facilitate the performance of, exemplary method steps.

As used herein, "facilitating" an action includes performing the action, making the action easier, helping to carry out the action, or causing the action to be performed. Thus, by way of example only and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a tangible computer-readable recordable storage medium (or multiple such media). Appropriate interconnections via bus, network, and the like can also be included.

Figure 6:
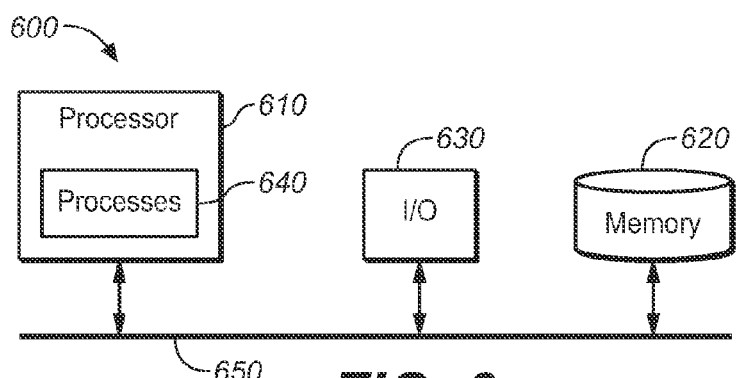
FIG. 6 is a block diagram depicting at least a portion of an exemplary electronic system adapted to perform methodologies according to embodiments of the present invention.

Embodiments of the invention may be particularly well-suited for use in an electronic device or alternative system (e.g., data processing systems, memory storage systems, cellular telephone systems, radio transmission systems, networking systems, etc.). For example, FIG. 6 is a block diagram depicting at least a portion of an exemplary processing system 600 according to an embodiment of the invention. System 600, which may represent, for example, a DSP, or a portion thereof, includes a processor 610 (e.g., NPCAL circuit 170 shown in FIG. 2), memory 620 coupled with the processor (e.g., via a bus 650 or alternative connection means) or embedded in the processor, as well as input/output (I/O) circuitry 630 operative to interface with the processor. The processor 610 may be configured to perform at least a portion of the functions according to embodiments of the invention (e.g., by way of one or more processes 640 which may be stored in memory 620 and loaded into processor 610), illustrative embodiments of which are shown in the previous figures and described herein above.

It is to be appreciated that the term "processor" as used herein is intended to include any processing device, such as, for example, one that includes a central processing unit (CPU) and/or other processing circuitry (e.g., network processor, microprocessor, DSP, etc.). Additionally, it is to be understood that a processor may refer to more than one processing device, and that various elements associated with a processing device may be shared by other processing devices. The term "memory" as used herein is intended to include memory and other computer-readable media associated with a processor or CPU, such as, for example, RAM, read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., display, etc.) for presenting results associated with the processor.

Accordingly, an application program, or software components thereof, including instructions or code for performing methodologies according to embodiments of the invention, as described herein, may be stored in a non-transitory manner in one or more of the associated storage media (e.g., ROM, fixed or removable storage) and, when ready to be utilized, loaded in whole or in part (e.g., into RAM) and executed by the processor. In any case, it is to be appreciated that at least a portion of the components shown in the previous figures may be implemented in various forms of hardware, software, or combinations thereof (e.g., one or more microprocessors with associated memory, application-specific integrated circuit(s) (ASICs), functional circuitry, one or more operatively programmed general purpose digital computers with associated memory, etc). Given the teachings of the embodiments of the invention provided herein, one of ordinary skill in the art will be able to contemplate other implementations of the embodiments of the invention.

At least a portion of the embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with embodiments of the invention can be employed in essentially any application and/or electronic system in which multiple processors or a bus interconnect may be employed. Suitable systems for implementing techniques of embodiments of the invention may include, but are not limited to, servers, personal computers, data storage networks, etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the inventive subject matter are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. An error correction data processing apparatus comprising:
   a noise predictive calibration circuit configured to calibrate a first set of filter coefficients based on a first data set and a second set of filter coefficients based on a second data set;
   a first noise predictive detector configured to receive the first set of filter coefficients;
   a decoder configured to perform a first global iteration with the first noise predictive detector and determine a violation check count value; and
   a second noise predictive detector configured to receive the second set of filter coefficients if the violation check count value is less than a predetermined value or receive the first set of filter coefficients if the violation check count value is greater than the predetermined value.

2. The apparatus of claim 1, wherein the decoder and the second noise predictive detector are configured to perform a second and above global iterations based on the second set of filter coefficients.

3. The apparatus of claim 1, wherein the second detector is modified by the second set of filter coefficients during detection in the second and above global iterations between the second noise predictive detector and the decoder if the violation check count value is less than the predetermined value.

4. The apparatus of claim 1 further comprising:
   a first buffer configured to store the first set of filter coefficients;
   a second buffer configured to store the second set of coefficients; and
   a multiplexer configured to switch between loading the first set of filter coefficients or the second set of filter coefficients to the second noise predictive detector.

5. The apparatus of claim 4 further comprising a comparator configured to trigger the multiplexer to switch between loading either the first set of filter coefficients or the second set of filter coefficients based on the violation check count value and the predetermined value.

6. The apparatus of claim 1 further comprising a loading circuit configured to load filter coefficients into the first noise predictive detector and into the second noise predictive detector.

7. The apparatus of claim 1, wherein the first noise predictive detector and the second noise predictive detector each comprise a soft output Viterbi algorithm detector (SOVA), or each comprise a maximum a posteriori (MAP) algorithm detector.

8. The apparatus of claim 1, wherein the decoder comprises a Low Density Parity Check (LDPC) algorithm.

9. The apparatus of claim 1, wherein the noise predictive calibration circuit applies a Least Mean Squares (LMS) algorithm to calibrate the first set of filter coefficients and the second set of filter coefficients.

10. The apparatus of claim 1 wherein the violation check count value represents a trapping set.

11. The apparatus of claim 1 wherein the predetermined value represents a type of error event.

12. The apparatus of claim 1, wherein at least a portion of the data processing apparatus is fabricated in at least one integrated circuit.

13. A method for improving error correction in a data processing system, the method comprising steps of:
   calibrating a first set of filter coefficients based on a first data set and calibrating a second set of filter coefficients based on a second data set;
   receiving, by a first noise predictive detector, the first set of filter coefficients;
   performing a first global iteration with the first noise predictive detector and a decoder and determining a violation check count value; and
   receiving, by a second noise predictive detector, the second set of filter coefficients if the violation check count value is less than a prescribed value or the first set of filter coefficients if the violation check count value is greater than the prescribed value.

14. The method of claim 13, further comprising performing a second and above global iterations based on the second set of filter coefficients between the decoder and the second noise predictive detector.

15. The method of claim 13, further comprising modifying the second noise predictive detector with the second set of filter coefficients during detection in the second and above global iterations between the second noise predictive detector and the decoder if the violation check count value is less than the prescribed value.

16. The method of claim 13, further comprising:
   storing in a first buffer the first set of filter coefficients;
   storing in a second buffer the second set of coefficients; and
   switching between loading the first set of filter coefficients or the second set of filter coefficients to the second noise predictive detector.

17. The method of claim 16, further comprising loading one of the first set of filter coefficients and the second set of filter coefficients as a function of the violation check count value and the prescribed value.

18. The method of claim 13, further comprising applying, by both the first noise predictive detector and the second predictive detector, a soft output Viterbi algorithm (SOVA) or applying a maximum a posteriori (MAP) algorithm.

19. The method of claim 13, further comprising applying a Low Density Parity Check (LDPC) by the decoder.

20. The method of claim 13, wherein the calibrating step further comprises applying a Least Mean Squares (LMS) algorithm.

21. The method of claim 13, wherein the violation check count value represents a trapping set.

22. The method of claim 13, wherein the prescribed value represents a type of error event.

23. A data processing system including first and second noise predictive detectors, the data processing system comprising:
   memory; and
   at least one processor coupled with the memory and operative: to obtain at least first and second data sets; to calibrate a first set of filter coefficients based on the first data set and to calibrate a second set of filter coefficients based on the second data set; to receive, by the first noise predictive detector, the first set of filter coefficients; to perform a first global iteration with the first noise predictive detector and a decoder and determining a violation check count value; and to receive, by the second noise predictive detector, the second set of filter coefficients if the violation check count value is less than a prescribed value or the first set of filter coefficients if the violation check count value is greater than the prescribed value.

24. An article of manufacture comprising a computer program product, said computer program product in turn comprising a non-transitory computer readable storage medium storing in a non-transitory manner executable program instructions which, when executed, implement the steps of a method according to claim 13.

* * * * *